(12) United States Patent
Ottens et al.

(10) Patent No.: US 7,224,438 B2
(45) Date of Patent: May 29, 2007

(54) METHOD OF MANUFACTURING A DEVICE, DEVICE MANUFACTURED THEREBY, COMPUTER PROGRAM AND LITHOGRAPHIC APPARATUS

(75) Inventors: Joost Jeroen Ottens, Veldhoven (NL); Marcel Nicolaas Jacobus Van Kervinck, Eindhoven (NL)

(73) Assignee: ASML Netherlands B.V., Veldhoven (NL)

( * ) Notice: Subject to any disclaimer, the term of this patent is extended or adjusted under 35 U.S.C. 154(b) by 0 days.

(21) Appl. No.: 10/738,980

(22) Filed: Dec. 19, 2003

(65) Prior Publication Data
US 2004/0189967 A1 Sep. 30, 2004

(30) Foreign Application Priority Data
Dec. 19, 2002 (EP) .................................. 02080451

(51) Int. Cl.
*G03B 27/54* (2006.01)
*G03B 27/42* (2006.01)

(52) U.S. Cl. .......................................... 355/67; 355/53
(58) Field of Classification Search .................. 355/53, 355/67–71; 356/399–401; 250/548
See application file for complete search history.

(56) References Cited

U.S. PATENT DOCUMENTS

| 5,331,371 A | 7/1994 | Mori et al. |
| 5,682,228 A | 10/1997 | Miyake |
| 5,760,881 A | 6/1998 | Miyazaki et al. |
| 5,854,671 A * | 12/1998 | Nishi ........................... 355/53 |
| 6,232,051 B1 | 5/2001 | Suzuki |
| 6,259,510 B1 * | 7/2001 | Suzuki ......................... 355/53 |
| 6,295,119 B1 * | 9/2001 | Suzuki ......................... 355/53 |
| 6,414,744 B1 | 7/2002 | Kuiper et al. |
| 6,462,807 B1 * | 10/2002 | Nishi ........................... 355/53 |
| 6,542,223 B1 | 4/2003 | Okazaki |
| 6,608,665 B1 * | 8/2003 | Nishi et al. .................... 355/53 |
| 2003/0025893 A1 | 2/2003 | Nishi |

FOREIGN PATENT DOCUMENTS

| JP | 61-104622 | 5/1986 |
| JP | 09-082633 | 3/1997 |
| JP | 2000-114164 | * 4/2000 |
| JP | 2000-269122 | 9/2000 |
| WO | WO 03/032082 | 4/2003 |

OTHER PUBLICATIONS

Japanese Office Action issued for Japanese Patent Application No. 2003-420697, dated Jan. 16, 2007.

* cited by examiner

*Primary Examiner*—Henry Hung Nguyen
(74) *Attorney, Agent, or Firm*—Pillsbury Winthrop Shaw Pittman LLP

(57) ABSTRACT

During scanned exposure of target portions at the edge of the substrate, the position of an edge of the illumination field is changed so as to prevent or reduce radiation falling onto the substrate table or to expose an L-shaped area. In this way the heat load on the substrate table can be reduced and dummy structures can fill a mouse bite without overlapping an alignment mark.

15 Claims, 5 Drawing Sheets

METHOD OF MANUFACTURING A DEVICE, DEVICE MANUFACTURED THEREBY, COMPUTER PROGRAM AND LITHOGRAPHIC APPARATUS

The present application claims priority to European Application No. 02080451.4, filed on Dec. 19, 2002, the entirety of which is hereby incorporated into the present application by reference thereto.

BACKGROUND OF THE INVENTION

1. Field of the Invention

The present invention relates to a method of manufacturing a device, a device manufactured thereby, a computer program for controlling a lithographic apparatus, and a lithographic apparatus.

2. Brief Description of Related Art

A lithographic apparatus is a machine that applies a desired pattern onto a target portion of a substrate. Lithographic apparatus can be used, for example, in the manufacture of integrated circuits (ICs). In that circumstance, a patterning device, such as a mask, may be used to generate a circuit pattern corresponding to an individual layer of the IC, and this pattern can be imaged onto a target portion (e.g. comprising part of, one or several dies) on a substrate (e.g. a silicon wafer) that has a layer of radiation-sensitive material (resist). In general, a single substrate will contain a network of adjacent target portions that are successively exposed. Known lithographic apparatus include so-called steppers, in which each target portion is irradiated by exposing an entire pattern onto the target portion in one go, and so-called scanners, in which each target portion is irradiated by scanning the pattern through the projection beam in a given direction (the "scanning" direction) while synchronously scanning the substrate parallel or anti-parallel to this direction.

When exposing a plurality of rectangular dies on a circular (except for the flat, if provided) substrate, it will be appreciated that not all of the substrate can be filled with whole dies; around the edges so-called mouse bites would be left unexposed. To ensure uniformity in subsequent processing, it is customary to perform exposures of dummy structures in the areas where complete dies cannot be fitted. The purpose is that complete dies near the edge of the substrate have neighborhoods that appear similar to the neighborhoods of dies in the center of the substrate and thus their subsequent processing is more similar. Otherwise, no structures would build up on the unexposed areas and the unexposed areas would remain smooth and after several process layers would be at a different level than the exposed areas. This can lead to undesirable effects such as variations in resist thickness at the edges, since the resist runs off more easily over the smooth unexposed areas, incorrect level measurements and/or undesirably abrupt leveling movements during a scan. It can also be desirable to expose dies that overlap the edge of the substrate if the mask contains more than one device and a whole device or devices, but not the whole mask image, can be accommodated by an edge die. The additional devices that are made in this way increase yield.

However, if exposures that overlap the edge of the substrate are carried out, the beam of radiation will fall on the substrate table leading to undesirable heating thereof. The substrate table will in general carry mirrors for the interferometric displacement measuring system (for which reason it is often referred to as the mirror block) which measures movements of the substrate table and these mirrors are maintained flat to a very high degree of accuracy. Localized heating of the substrate table leading to thermal expansion can distort the mirrors and cause errors in the measurement of the position of the substrate table, leading to overlay errors in exposures. U.S. Pat No. 6,232,051 and U.S. Pat. No. 5,331,371 disclose the use of masking blades in step and repeat type lithographic apparatus to prevent unwanted radiation from falling on the substrate table during the exposure of edge dies but do not suggest how the problem may be overcome in a scanned exposure.

Also, in some cases, alignment marks may be located in the mouse bites and these are protected from subsequent exposures. As shown in FIG. 2 of the accompanying drawings, to expose dummy structures in the part of the mouse bite not occupied by the alignment marker P2 whilst not exposing the alignment marker, requires the performance of two exposures 11, 12 to expose an L-shaped area on the substrate bordering the whole dies C but not covering the alignment marker P2. The necessity to perform two exposures is an undesirable loss of throughput. U.S. Pat No. 5,760,881 discloses shields at substrate level that can be moved over the substrate to protect alignment marks.

SUMMARY

One aspect of the present invention is to provide a method of exposing structures on a substrate in a non-rectangular area, for example around an area to be protected, in a shorter period of time.

According to an aspect of the invention, there is provided a method of manufacturing a device comprising: projecting a patterned beam of radiation onto a target portion of a substrate while scanning the substrate in a scan direction, and changing a position of an edge of the cross-section of the beam of radiation in a direction perpendicular to the scan direction while projecting the patterned beam of radiation onto the target portion.

By changing the position of an edge of the beam of radiation in the direction (X) perpendicular to the scanning direction (Y) during a scanned exposure, it is possible to expose an approximately L-shaped area in a single exposure step, which can be performed more quickly than two separate exposure steps because of the reduced overhead in repositioning the substrate for the second exposure. Dummy structures can be created around, but not overlapping, an area to be protected, such as an alignment mark. Also, dummy structures more completely filling a "mouse bite" can be created.

Changing the position of an edge of the beam of radiation in the X-direction would not normally be contemplated because the area exposed during the part of the scan during which the edge moves would exhibit a gradual change of dose. Thus structures in the transitional region will not be exposed properly and will likely tail off unpredictably rather than terminating cleanly. This, however does not matter when the structures being exposed are dummy structures rather than parts of complete dies—the structures will still perform their task of making the neighborhood of dies at the edge of the substrate more similar to those of dies in the middle.

According to one aspect, the method can also be used to expose useful structures where the whole exposure field contains multiple devices and one or more devices can be accommodated in the irregularly shaped exposure, away from the transition area where the dose is non-uniform. Further, the method may be used at the edge of the substrate even when there is no marker to protect. An irregularly shaped area that more closely fits onto the substrate can be exposed whilst avoiding exposure radiation being incident on the substrate table, thereby protecting the table and reducing stray light that might undesirably expose parts of the substrate.

Of course the width of the beam can be increased or decreased during the scan, depending on whether the scan begins at the "top" or "bottom" of the L-shape.

Another aspect of the invention provides a computer-readable medium encoded with a computer program for controlling a lithographic apparatus to manufacture devices, the program comprising program code that, when executed by a control system of the lithographic apparatus, instructs the lithographic apparatus to perform the method including projecting a patterned beam of radiation onto a target portion of a substrate while scanning the substrate in a scan direction, and changing a position of an edge of the cross-section of the beam of radiation in a direction perpendicular to the scan direction while projecting the patterned beam of radiation onto the target portion.

Such a computer program may be provided in a newly constructed apparatus or as an upgrade to an existing apparatus.

Another aspect of the invention provides a substrate for a lithographic apparatus, comprising: a top surface including a target portion exposed during projection of a patterned beam of radiation in a scanning direction along the top surface of the substrate, the target portion including a functional structure formed by the patterned beam of radiation, the target portion having an edge extending at an acute angle with respect to the scanning direction, the edge being adjacent to a nonfunctional structure formed by the patterned beam of radiation and positioned within the target portion.

Another aspect of the invention provides a lithographic projection apparatus, comprising a radiation system constructed to provide a beam of radiation; a support to support a patterning device to pattern the beam of radiation according to a desired pattern to form a patterned beam of radiation; a substrate table to hold a substrate; and a projection system constructed to project the patterned beam of radiation onto a target portion of the substrate while the substrate table is scanned in a first direction relative in the beam of radiation; a beam interceptor constructed to intercept a part of the beam of radiation that is projected outside the substrate; and a controller configured to control the beam interceptor to change a position of an edge of the patterned beam of radiation in a second direction that is perpendicular to the first direction while the beam of radiation is projected onto the substrate.

Another aspect of the invention provides a lithographic projection apparatus, comprising a substrate; means for providing a beam of radiation: means for imparting a cross-section of the beam of radiation with a pattern to form a patterned beam; and means for projecting the patterned beam of radiation onto a target portion of the substrate while scanning the substrate in a scan direction, and changing a position of an edge of the cross-section of the beam of radiation in a direction perpendicular to the scan direction while projecting the patterned beam of radiation onto the target portion.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist) or a metrology or inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

The terms "radiation" and "beam" used herein encompass all types of electromagnetic radiation, including ultraviolet (UV) radiation (e.g. having a wavelength of 365, 248, 193, 157 or 126 nm) and extreme ultra-violet (EUV) radiation (e.g. having a wavelength in the range of 5–20 nm), as well as particle beams, such as ion beams or electron beams.

The term "patterning device" or "patterning structure" used herein should be broadly interpreted as referring to a device or structure that can be used to impart a beam of radiation with a pattern in its cross-section such as to create a pattern in a target portion of the substrate. It should be noted that the pattern imparted to the beam may not exactly correspond to the desired pattern in the target portion of the substrate. Generally, the pattern imparted to the beam will correspond to a particular functional layer in a device being created in the target portion, such as an integrated circuit.

Patterning device may be transmissive or reflective. Examples of patterning device include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions; in this manner, the reflected beam is patterned. In each example of patterning device, the support may be a frame or table, for example, which may be fixed or movable and which may ensure that the patterning device is at a desired position, for example with respect to the projection system. Any use of the terms "reticle" or "mask" herein may be considered synonymous with the more general term "patterning device".

The term "projection system" used herein should be broadly interpreted as encompassing various types of projection system, including refractive optical systems, reflective optical systems, and catadioptric optical systems, as appropriate for example for the exposure radiation being used, or for other factors such as the use of an immersion fluid or the use of a vacuum. Any use of the term "lens" herein may be considered as synonymous with the more general term "projection system".

The illumination system may also encompass various types of optical components, including refractive, reflective, and catadioptric optical components for directing, shaping, or controlling the beam of radiation, and such components may also be referred to below, collectively or singularly, as a "lens."

The lithographic apparatus may be of a type having two (dual stage) or more substrate tables (and/or two or more mask tables). In such "multiple stage" machines the additional tables may be used in parallel, or preparatory steps may be carried out on one or more tables while one or more other tables are being used for exposure.

The lithographic apparatus may also be of a type wherein the substrate is immersed in a liquid having a relatively high refractive index, e.g. water, so as to fill a space between the final element of the projection system and the substrate. Immersion liquids may also be applied to other spaces in the lithographic apparatus, for example, between the mask and the first element of the projection system. Immersion techniques are well known in the art for increasing the numerical aperture of projection systems.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION OF ILLUSTRATED EMBODIMENTS

Figure 1:
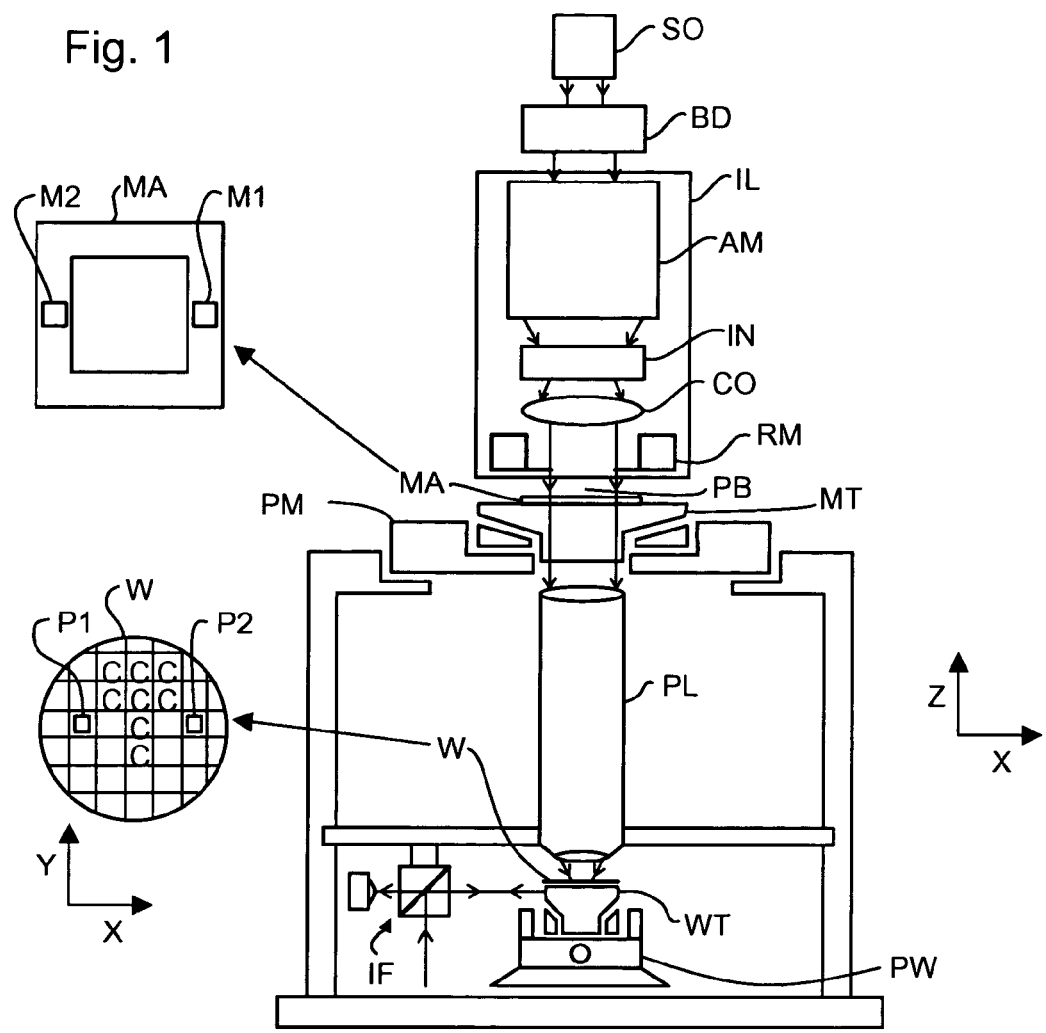
FIG. 1 depicts a lithographic apparatus which may be used to perform methods of an embodiment of the invention.

FIG. 1 schematically depicts a lithographic apparatus which may be used to perform methods of an embodiment of the invention. The apparatus comprises: an illumination system (illuminator) IL to provide a beam PB of radiation (e.g. UV radiation or DUV radiation); a first support (e.g. a mask table) MT to support a patterning device (e.g. a mask) MA and connected to first positioning device PM that accurately positions the patterning device with respect to a projection system PL; a substrate table (e.g. a wafer table) WT to hold a substrate (e.g. a resist-coated wafer) W and connected to second positioning device PW that accurately positions the substrate with respect to projection system PL; and the projection system (e.g. a refractive projection lens) PL to project a pattern imparted to the beam PB by patterning device MA onto a target portion C (e.g. comprising one or more dies) of the substrate W.

As here depicted, the apparatus is of a transmissive type (e.g. employing a transmissive mask). Alternatively, the apparatus may be of a reflective type (e.g. employing a programmable mirror array of a type as referred to above).

The illuminator IL receives radiation from a radiation source SO. The source and the lithographic apparatus may be separate entities, for example when the source is an excimer laser. In such cases, the source is not considered to form part of the lithographic apparatus and the radiation is passed from the source SO to the illuminator IL with the aid of a beam delivery system BD comprising for example suitable directing mirrors and/or a beam expander. In other cases the source may be integral part of the apparatus, for example when the source is a mercury lamp. The source SO and the illuminator IL, together with the beam delivery system BD if provided, may be referred to as a radiation system.

The illuminator IL may comprise an adjuster AM that adjusts the angular intensity distribution of the beam. Generally, at least the outer and/or inner radial extent (commonly referred to as σ-outer and σ-inner, respectively) of the intensity distribution in a pupil plane of the illuminator can be adjusted. In addition, the illuminator IL generally comprises various other components, such as an integrator IN and a condenser CO. The illuminator provides a conditioned beam of radiation, referred to as the projection beam PB, having a desired uniformity and intensity distribution in its cross-section.

Included in the illuminator IL is a masking device RM which defines the area on the patterning device that is illuminated. The masking device may comprise four blades whose positions are controllable, e.g. by stepper motors, so that the cross-section of the beam may defined. It should be noted that the masking device need not be positioned proximate the patterning device but in general will be located in a plane that is imaged onto the patterning device (a conjugate plane of the patterning device). The open area of the masking device defines the area on the patterning device that is illuminated but may not be exactly the same as that area, e.g. if the intervening optics have a magnification different than 1.

The beam PB is incident on a patterning device, illustrated in the form of the mask MA, which is held on the mask table MT. Having traversed the mask MA, the beam PB passes through the lens PL, which focuses the beam onto a target portion C of the substrate W. With the aid of the second positioning device PW and position sensor IF (e.g. an interferometric device), the substrate table WT can be moved accurately, e.g. so as to position different target portions C in the path of the beam PB. Similarly, the first positioning device PM and another position sensor (which is not explicitly depicted in FIG. 1) can be used to accurately position the mask MA with respect to the path of the beam PB, e.g. after mechanical retrieval from a mask library, or during a scan. In general, movement of the object tables MT and WT will be realized with the aid of a long-stroke module (coarse positioning) and a short-stroke module (fine positioning), which form part of the positioning devices PM and PW. However, in the case of a stepper (as opposed to a scanner) the mask table MT may be connected to a short stroke actuator only, or may be fixed. Mask MA and substrate W may be aligned using mask alignment marks M1, M2 and substrate alignment marks P1, P2.

The depicted apparatus can be used in the following preferred modes.

In step mode, the mask table MT and the substrate table WT are kept essentially stationary, while an entire pattern imparted to the beam is projected onto a target portion C in one go (i.e. a single static exposure). The substrate table WT is then shifted in the X and/or Y direction so that a different target portion C can be exposed. In step mode, the maximum size of the exposure field limits the size of the target portion C imaged in a single static exposure. Aspects of the invention may not be used when the apparatus is used in this mode.

In scan mode, the mask table MT and the substrate table WT are scanned synchronously while a pattern imparted to the beam is projected onto a target portion C (i.e. a single dynamic exposure). The velocity and direction of the substrate table WT relative to the mask table MT is determined by the magnification, demagnification, and image reversal characteristics of the projection system PL. In scan mode, the maximum size of the exposure field limits the width (in the non-scanning direction) of the target portion in a single dynamic exposure, whereas the length of the scanning motion determines the height (in the scanning direction) of the target portion.

In another mode, the mask table MT is kept essentially stationary holding a programmable patterning device, and the substrate table WT is moved or scanned while a pattern imparted to the beam is projected onto a target portion C. In this mode, generally a pulsed radiation source is employed and the programmable patterning device may be updated after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

Figure 2:
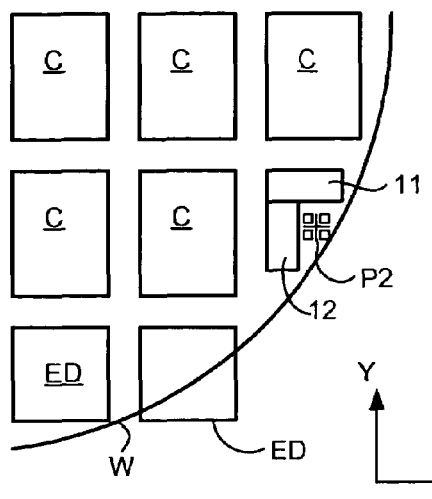
FIG. 2 depicts exposures around an alignment mark performed in a prior art method.

As shown in FIG. 2, in a conventional method, to print dummy (nonfunctional) structures in a mouse bite whilst protecting an alignment mark in that area, two exposures 11, 12 are necessary. This creates an L-shaped region of dummy structures. According to an aspect of the invention shown in FIG. 3, a single scanned exposure 13 is performed and during the scan, the width of the illumination field in the direction (X) perpendicular to the scanning direction (Y) is reduced so that an approximately L-shaped region is exposed, albeit with one inclined edge.

Figure 4:
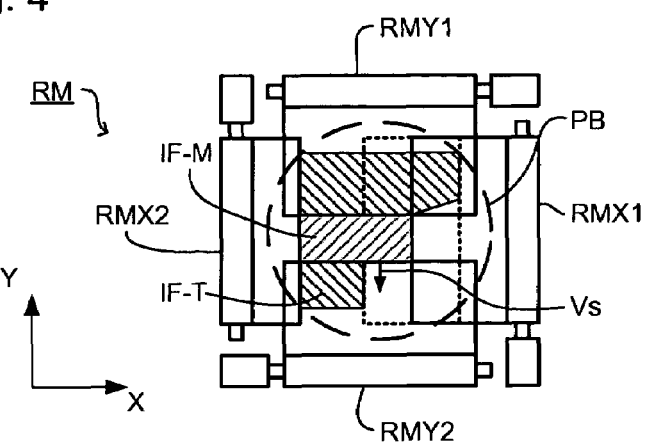
FIG. 4 depicts a masking device used in performance of a method of an embodiment of the invention.

FIG. 4 shows the masking device RM, which is used to accomplish this. The device consists of four blades; two blades RMY1, RMY2 project into the beam PB form the plus and minus Y directions respectively and two blades RMX1, RMX2 project into the beam from the plus and minus X directions respectively. During a scan, the Y blades RMY1, RMY2 move in the scan direction with velocity Vs, maintaining a constant separation so as to generate an elongate illumination field that sweeps across the patterning device. Depending on the optics between the masking device and the patterning device the illumination field may be curved, rather than rectangular and may be scaled relative to the open area of the masking device. This is conventional.

Figure 5:
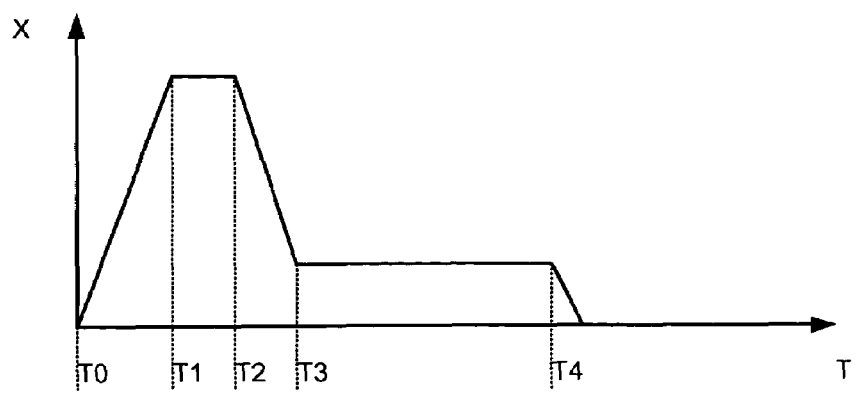
FIG. 5 is a graph of the position of a masking device over time in a method of an embodiment of the invention.

According to an aspect of the invention, one or both of the X masking blades RMX1, RMX2 is moved during the scan so as that the width of the illumination field or its position in the X direction changes during the scan. In the example shown, masking blade RMX1 is in a retracted position at the beginning of a scan, time T1, and, at a certain point, time T2, is moved outwards to close down the illumination field for the narrow part of the L-shape. Having reached the necessary maximum extension, at time T3, the blade remains stationary until the end of the scan at T4. In FIG. 4, the initial and final positions of the blade are shown in dashed line and an intermediate position is shown in solid. The area IF-T illuminated during the totality of the scan is shown in single diagonal hatching and the momentary illumination field IF-M is shown cross-hatched. FIG. 5, is a graph of the width of the illumination field during the scan and include initial and final periods during which the illumination field is opened and closed.

Figure 3:
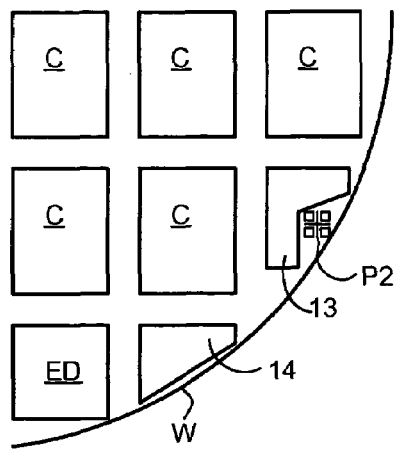
FIG. 3 depicts exposures around an alignment mark performed in a method of an embodiment of the invention.

It will also be appreciated that changing the width of the illumination field can be used to create areas of dummy patterns with inclined edges to more closely fill the mouse bites, as shown at 14 in FIG. 3, whilst avoiding the beam spilling over the edge of the substrate. As shown in FIG. 2, to provide structures in an irregularly shaped area the exposure is conventionally allowed to spill over the edge of the substrate. In this way the substrate table can be protected—it may contain components that might be damaged by the exposure radiation or by the concentrated heat load of the beam—and the generation of stray light can be reduced. Moving both blades, without necessarily changing the width of the illumination field, can be used to create diagonal regions of dummy structures.

Figure 6:
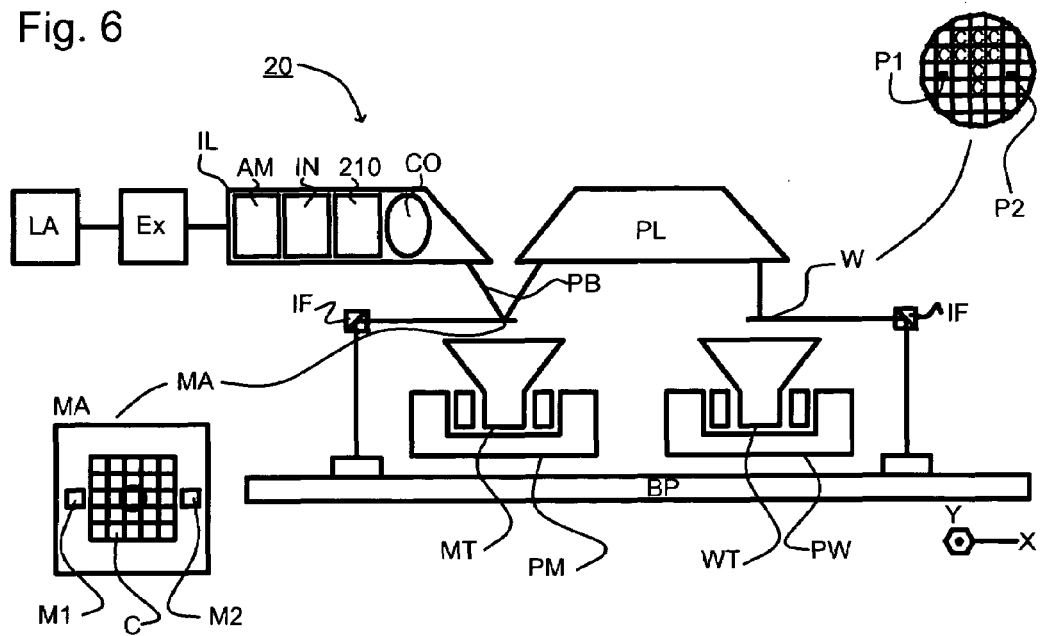
FIG. 6 depicts a lithographic projection apparatus according to a second embodiment of the invention.

FIG. 6 schematically depicts a lithographic projection apparatus 20 according to a second embodiment of the invention. The apparatus comprises: a radiation system Ex, IL, to supply a beam PB of radiation (e.g. EUV-radiation). In this particular case, the radiation system also comprises a radiation source LA; a first object table (mask table) MT provided with a mask holder to hold a mask MA (e.g. a reticle), and connected to first positioning device PM that accurately positions the mask with respect to projection system PL; a second object table (substrate table) WT provided with a substrate holder to hold a substrate W (e.g. a resist-coated silicon wafer), and connected to second positioning device PW that accurately positions the substrate with respect to projection system PL; and the projection system ("lens") PL (e.g. projection optics box) projects an irradiated portion of the mask MA onto a target portion C (e.g. comprising one or more dies) of the substrate W.

As here depicted, the apparatus is of a reflective type (i.e. has a reflective mask). However, in general, it may also be of a transmissive type, for example (with a transmissive mask). Alternatively, the apparatus may employ another kind of patterning device, such as a programmable mirror array of a type as referred to above.

The source LA produces radiation. This beam is fed into an illumination system (illuminator) IL, either directly or after having traversed a conditioning device, such as a beam expander Ex, for example. The illuminator IL may comprise an adjuster AM that sets the outer and/or inner radial extent (commonly referred to as σ-outer and σ-inner, respectively) of the intensity distribution in the beam. In addition, it will generally comprise various other components, such as an integrator IN and a condenser CO. In this way, the beam PB impinging on the mask MA has a desired uniformity and intensity distribution in its cross-section.

The lithographic projection apparatus further comprises a beam interceptor 210, as will be explained below. The beam interceptor 210 could be part of the illumination system IL, but could also be positioned at other places along the path of the projection beam in the lithographic projection apparatus.

With reference to FIG. 6 it should be noted that the source LA may be within the housing of the lithographic projection apparatus (as is often the case when the source LA is a mercury lamp, for example), but that it may also be remote from the lithographic projection apparatus, the radiation beam which it produces being led into the apparatus (e.g.

with the aid of suitable directing mirrors); this latter scenario is often the case when the source LA is an excimer laser. Aspects of the invention and claims encompass both of these scenarios.

The beam PB subsequently intercepts the mask MA, which is held on a mask table MT. Having been selectively reflected by the mask MA, the beam PB passes through the lens PL, which projects the beam PB onto a target portion C of the substrate W. With the aid of the second positioning device PW (and interferometric measuring structure IF), the substrate table WT can be moved accurately, e.g. so as to position different target portions C in the path of the beam PB. Similarly, the first positioning device PM can be used to accurately position the mask MA with respect to the path of the beam PB, e.g. after mechanical retrieval of the mask MA from a mask library, or during a scan. In general, movement of the object tables MT, WT will be realized with the aid of a long-stroke module (coarse positioning) and a short-stroke module (fine positioning), which are not explicitly depicted in FIG. 1. However, in the case of a wafer stepper (as opposed to a step-and-scan apparatus) the mask table MT may just be connected to a short stroke actuator, or may be fixed. Mask MA and substrate W may be aligned using mask alignment marks M1, M2 and substrate alignment marks P1, P2.

The depicted apparatus can be used in two different modes.

In step mode, the mask table MT is kept essentially stationary, and an entire mask image is projected at once (i.e. a single "flash") onto a target portion C. The substrate table WT is then shifted in the x and/or y directions so that a different target portion C can be irradiated by the beam PB; and In scan mode, essentially the same scenario applies, except that a given target portion C is not exposed in a single "flash".Instead, the mask table MT is movable in a given direction (the so-called "scan direction", e.g. the y direction) with a speed v, so that the beam PB is caused to scan over a mask image; concurrently, the substrate table WT is simultaneously moved in the same or opposite direction at a speed V=Mv, in which M is the magnification of the lens PL (typically, M=¼ or ⅕). In this manner, a relatively large target portion C can be exposed, without having to compromise on resolution.

Figure 7:
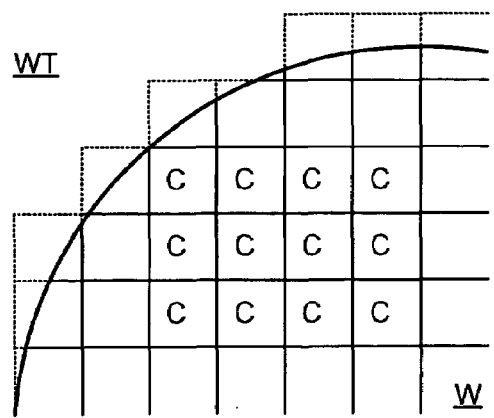
FIG. 7 depicts a part of a substrate divided in substantially rectangular target portions according to an embodiment of the invention.

FIG. 7 shows part of a substrate W that is divided in rectangular dies or target portions C. The Figure clearly shows that target portions C on the edge of the substrate W are only partially on the substrate W. Exposing these target portions C will cause exposure energy falling on the object table WT or on the positioning structure or the interferometric displacement measuring structure, e.g. the measurement mirrors, heating up these parts.

Figure 8:
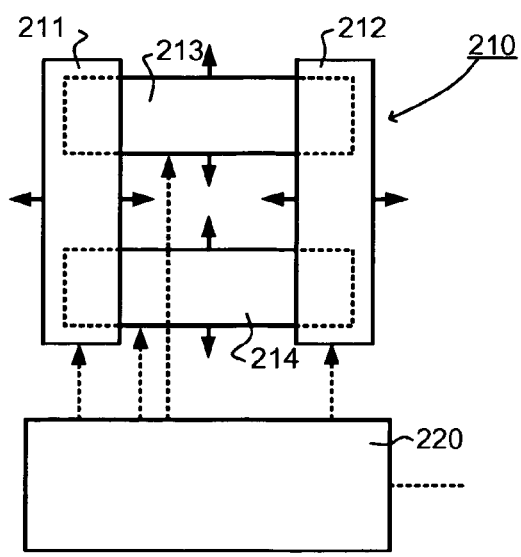
FIG. 8 depicts a beam interceptor according to an embodiment of the invention.

According to an embodiment of the invention, the radiation system Ex, Il is provided wit a beam interceptor 210, comprising opaque blades 211, 212, 213, 214 that are arranged to intercept part of the beam PB, as is shown in FIG. 8. The blades 211, 212, 213, 214 manipulate the size and shape of the exposed beam PB on the mask MA and accordingly on the target portions C. These blades 211, 213, 214 are preferably formed by two first blades 211, 212 and two further blades 213, 214, that are substantially perpendicular orientated with respect to the first blades 211, 212. The blades 211, 212, 213, 214 enclose a translucent, substantially rectangular inner area, as is clearly depicted in FIG. 8, and are moveably mounted to the radiation system Ex, Il. The first blades 211, 212, can move in a first direction, and the further blades 213, 214 can move in a second direction, substantially perpendicular to the movement of the first blades 211, 212, as indicated by the arrows in FIG. 8.

The movement and positioning of the blades 211, 212, 213, 214 is controlled by a control system 220. The control system 220 is arranged to communicate with a further control system (not shown) controlling the rest of the lithographic projection apparatus in order to receive information about the size of the substrate, the starting position of the projection process, the order in which the subsequent target portions C will be projected etc. Based on this information, the control system 220 can determine if a projected target portion C is fully positioned on the substrate W or not. If not, the control system 220 is arranged to define a new size for this particular target portion C and actuate the beam interceptor 210 accordingly. This will minimize the excess exposure, as will be explained below with reference to FIG. 9. The control system 220 can also be formed as an integral part of a further control system (not shown) controlling the lithographic projection apparatus as a whole. Structure is provided to move the blades 211, 212, 213, 214. Incorporation of this structure is not further explained or showed in the drawings, since these techniques are known, for instance from X-ray technology, and incorporation will therefore be straight forward for a person skilled in the art.

Figure 9A:
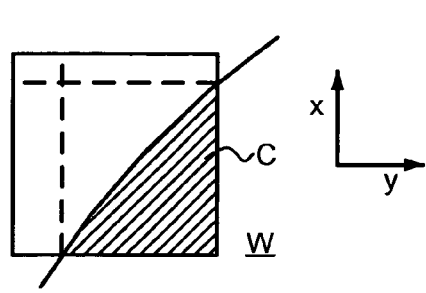
FIGS. 9a, 9b, 9c, 9d and 9e depict different modes of the beam interceptor according to an embodiment of the invention.

FIG. 9a depicts a part of the edge of a substrate W. The square drawn in fixed lines indicates the dimensions of a target portion C that is only partially on the substrate W. As can be seen, a significant part of the target portion C is located outside the substrate W. In accordance with an aspect of the invention, the control system 220 will actuate the beam interceptor 210 in such a way that only a smaller square, indicated by the dashed lines, is exposed by the beam PB. This can be done by putting the blades corresponding to the upper and left hand edge of the target portion C (with reference to FIG. 9) in such a position that the upper and left hand edge of the beam PB correspond to the dashed lines. The blades 211, 212, 213, 214 will be positioned automatically by control system 220 before the projection commences. This will significantly decrease the excessive exposure, as can be seen in FIG. 9a.

Figure 9B:
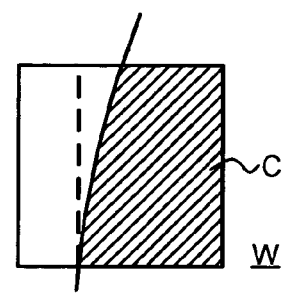
Figure 9C:
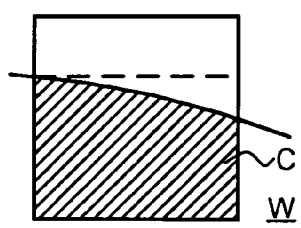
Figure 9D:
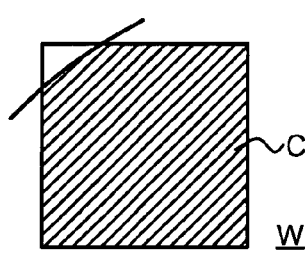

FIG. 9b and 9c show other possible situations, wherein only one of the blades 211, 212, 213, 214 can be used to intercept part of the beam PB as will readily be understood. The situation depicted in FIG. 9d doesn't allow for intercepting any part of the beam at all.

Also other embodiments (not shown) can be envisaged. The beam interceptor 10 can for instance also be provided with further blades, that are positioned in a diagonal position with respect to each other. Also blades could be provided that are not just arranged to move in a certain direction, but are also arranged to rotate. Such embodiments could even further minimize the excessive exposure.

Figure 9E:
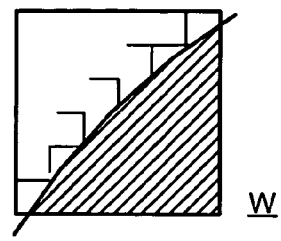

FIG. 9e shows yet another embodiment according to the present invention. In this embodiment, the beam PB is projected in subsequent slides to target portion C. Every slide projects a further part of the target portion C. Between the exposure of every slide, the beam interceptor automatically adjusts the positions of the blades 211, 212, 213, 214. As will readily be understood by a person skilled in the art, only those parts of the target portion C on the left of the dashed lines as indicated in FIG. 9e, will be exposed to the projection beam PB.

Before exposing each target portion C, the control system 220 will determine whether the target portion C is fully positioned on the wafer or not, and if not, the control system 220 will determine which blades need to be put in what position in order to minimize the excessive energy exposure.

Finally, the control system 220 will actuate the blades 211, 212, 213, 214 to rake the appropriate positions. The control system 220 could be provided with a detection system to detect what target portion C is under the beam PB and what the exact position is of the substrate W. However, since the starting position, projection order of the target portions C, dimensions of the substrate W are all known parameters, the control system 220 can also actuate the beam interceptor 210 without using information obtained from such a detection system.

In order to provide a sharp image of the blades 211, 212, 213, 214 on the target portion C, the beam interceptor 210 is preferably positioned in a focal plane of the beam PB. This could be in the radiation system Ex, IL as is shown in FIG. 1. However, the blades could also be placed in another focal plane of the beam PB, for instance in the lens PL.

The beam interceptor 210 can also be positioned in a position close to the mask MA or the substrate W. In that case, the blades 211, 212, 213, 214 are not exactly in a focal plane of the beam PB and are subject to projection blur. Therefore, the blades 211, 212, 213, 214 are not sharply projected on the substrate, due to which wide margins need to be taken into account. However, the blades 211, 212, 213, 214 could still generate a significant decrease of the excessive exposure.

Most lithographic projection apparatus are provided with reticle masking blades, also known as REMA-blades. These REMA-blades are well known to a person skilled in the art and are used to define the size of the part of the target portion C being exposed. Before a sequence of target portions C are exposed, the position of these REMA-blades are adjusted to generate a beam PB that corresponds to the size of the target portion C. These REMA-blades are formed in a way that is substantially similar to the beam interceptor 210 described above. Therefore, in a preferred embodiment, the known REMA-blades can be used as a beam interceptor 210.

Figure 10:
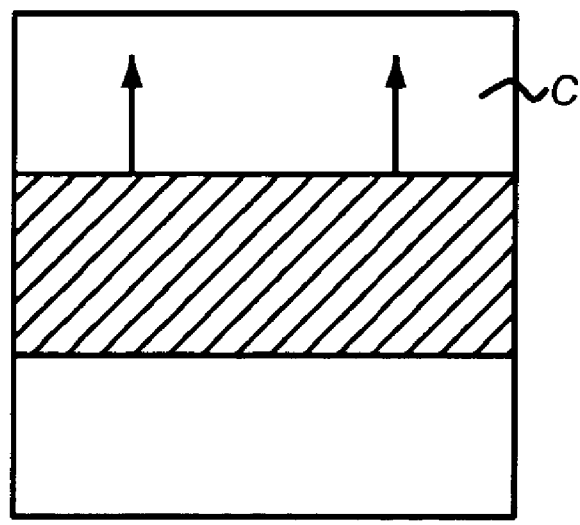
FIG. 10 depicts a slit of light projected on a target portion according to an embodiment of the invention.

As described above, the target portions C can be exposed in several modes, one of which is the scan mode. In the scan mode, a slit of light is moved over the surface of the target portions C. In order to do that, the REMA-blades need to be actuated in such a way, that not the full target portion C is exposed in a single flash, as is done in the step mode, but only a slit of light is projected. The slit preferably has a rectangular or arcuate shape, of which for instance the width corresponds to the width of the target portion C, and the height is substantially smaller than the height of the target portion C. The beam is moved over the surface of the target portion C in order to expose the whole target portion C. This is depicted in FIG. 10, in which the slit is indicated by the diagonal hatching. Moving the beam PB over the surface of the target portion C can be done by moving the mask MA and the substrate W accordingly, but can also be done by moving the REMA-blades. In both cases, when the slit reaches the top or bottom part of the target portion C, the horizontal REMA-blades need to be brought closer together in order to avoid exposing of adjacent target portions C, as will readily be understood by a person skilled in the art.

Figure 11:
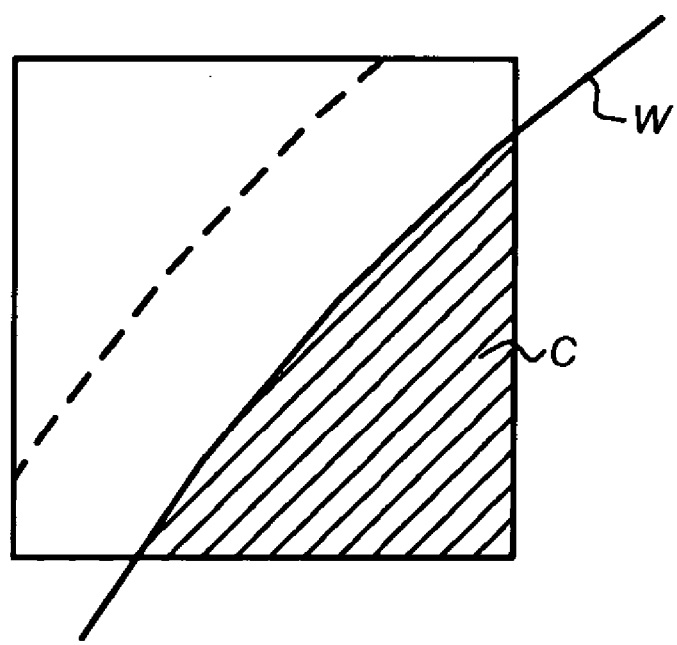
FIG. 11 depicts a third embodiment of the present invention.

In a preferred embodiment, the position of the blades 211, 212, 213, 214 of the beam interceptor 210, or for instance the REMA-blades, is altered during the scanning process, in such a way that the blades follow the contour of the substrate W. This is explained with reference to FIG. 11. During the movement of the slit over the target portion C, as was explained with reference to FIG. 10, the blade of the beam interceptor 210 corresponding to the left edge of the beam PB (according to FIG. 11) can be moved in such a way, that the left edge of the beam PB follows the edge of the substrate W. As will be understood by a person skilled in the art, a margin need to be taken into account, as result of the height of the slit. The beam PB will follow the dashed line, depicted in FIG. 11. In order to do this, the control system 20 should be arranged to actuate the blades 211, 212, 213, 214 in a dynamic and accurate way. This technique can only be used in a lithographic projection apparatus that uses the scan mode.

While specific embodiments of the invention have been described above, it will be appreciated that the aspects of the invention may be practiced otherwise than as described. The description is not intended to limit the aspects of the invention.

What is claimed is:

1. A method of manufacturing a device, comprising:
patterning a cross-section of a beam of radiation with a patterning device to form a patterned beam of radiation;
projecting the patterned beam of radiation onto a target portion of a substrate while scanning the substrate in a scan direction, and
changing a position of an edge of the cross-section of the beam of radiation in a direction perpendicular to the scan direction and changing a width of the cross-section of the beam of radiation while projecting the patterned beam of radiation onto the target portion and while scanning the substrate in the scan direction.

2. A method according to claim 1, wherein
projecting the patterned beam of radiation onto the target portion includes changing the position of the edge of the cross-section of the beam of radiation to change the width of the cross-section of the beam of radiation in the direction perpendicular to the scan direction.

3. A method according to claim 2 wherein
projecting the patterned beam of radiation onto the target portion includes exposing an approximately L-shaped area of the substrate.

4. A method according to claim 1, wherein
projecting the patterned beam of radiation onto the target portion includes the area of said substrate exposed during the projecting having at least one edge extending at an acute angle to said scanning direction.

5. A method according to claim 1, wherein
changing of the position of the edge of the cross-section of the beam of radiation exposes patterns in the target portion in an area affected by the change of position of the edge of the cross-section to form structures that are nonfunctional and distinct from functional structures of the device manufactured by the method.

6. A method according to claim 5, wherein
changing of the position of the edge of the cross-section of the beam of radiation includes forming nonfunctional structures adjacent to an alignment mark on the substrate.

7. A method according to claim 5, wherein
changing of the position of the edge of the cross-section of the beam of radiation includes forming nonfunctional structures adjacent to an edge of said substrate.

8. A computer-readable medium encoded with a program for controlling a lithographic apparatus to manufacture devices, the program comprising program code that, when executed by a control system of said lithographic apparatus, instructs the lithographic apparatus to perform the method comprising:
patterning a cross-section of a beam of radiation with a patterning device to form a patterned beam of radiation;

projecting the patterned beam of radiation onto a target portion of a substrate while scanning the substrate in a scan direction, and changing a position of an edge of the cross-section of the beam of radiation in a direction perpendicular to the scan direction and changing a width of the beam of radiation while projecting the patterned beam of radiation onto the target portion and while scanning the substrate in the scan direction.

9. A lithographic projection apparatus, comprising:

a radiation system constructed to provide a beam of radiation;

a support to support a patterning device to pattern the beam of radiation according to a desired pattern to form a patterned beam of radiation;

a substrate table to hold a substrate; and a projection system constructed to project said patterned beam of radiation onto a target portion of said substrate while said substrate table is scanned in a first direction relative to said beam of radiation;

a beam interceptor constructed to intercept a part of said beam of radiation that is projected outside said substrate; and a controller structured to control said beam interceptor to change a position of an edge of said beam of radiation in a second direction that is perpendicular to said first direction and to change a width of the beam of radiation while said patterned beam of radiation is projected onto said substrate and while said substrate table is scanned.

10. A lithographic projection apparatus according to claim 9, wherein said beam interceptor includes blades that enclose a transparent inner area, said blades being rotatable so as to change dimensions and a shape of said inner area, to determine which part of said beam of radiation is intercepted.

11. A lithographic projection apparatus according to claim 9, wherein said beam interceptor includes reticle masking blades.

12. A lithographic apparatus according to claim 11, wherein the blades are constructed and arranged to be moved while said substrate table is scanned in a first direction relative to said beam of radiation so that the beam of radiation follows the contour of the substrate.

13. A lithographic apparatus according to claim 9, wherein the beam interceptor is positioned in a focal plane of the beam of radiation.

14. A lithographic projection apparatus, comprising:

means for providing a beam of radiation:

means for imparting a cross-section of said beam of radiation with a pattern to form a patterned beam; and means for projecting said patterned beam of radiation onto a target portion of said substrate while scanning the substrate in a scan direction, and changing a position of an edge of said cross-section of said beam of radiation in a direction perpendicular to said scan direction and changing a width of the beam of radiation while projecting said patterned beam of radiation onto said target portion and while scanning the substrate in the scan direction.

15. A lithographic projection apparatus according to claim 14, further comprising:

means for intercepting a part of said beam of radiation that is projected outside said substrate;

means for controlling said means for intercepting to change a position of an edge of said patterned beam of radiation in a second direction that is perpendicular to said first direction while said patterned beam of radiation is projected onto said substrate.

* * * * *